(12) United States Patent
Kawamura

(10) Patent No.: US 10,546,953 B2
(45) Date of Patent: Jan. 28, 2020

(54) SEMICONDUCTOR DEVICE INCLUDING AN ELECTRODE HAVING A PART WITH AN INVERSE TAPERED SHAPE

(71) Applicants: Kabushiki Kaisha Toshiba, Minato-ku (JP); Toshiba Electronic Devices & Storage Corporation, Minato-ku (JP)

(72) Inventor: Keiko Kawamura, Kawasaki (JP)

(73) Assignees: Kabushiki Kaisha Toshiba, Minato-ku (JP); Toshiba Electronic Devices & Storage Corporation, Minato-ku (JP)

(*) Notice: Subject to any disclaimer, the term of this patent is extended or adjusted under 35 U.S.C. 154(b) by 13 days.

(21) Appl. No.: 15/912,711

(22) Filed: Mar. 6, 2018

(65) Prior Publication Data

US 2019/0088778 A1    Mar. 21, 2019

(30) Foreign Application Priority Data

Sep. 20, 2017  (JP) ................. 2017-180736

(51) Int. Cl.
| | |
|---|---|
| H01L 29/78 | (2006.01) |
| H01L 29/08 | (2006.01) |
| H01L 29/10 | (2006.01) |
| H01L 29/41 | (2006.01) |
| H01L 29/423 | (2006.01) |
| H01L 29/66 | (2006.01) |
| H01L 27/24 | (2006.01) |
| H01L 29/417 | (2006.01) |

(52) U.S. Cl.
CPC ...... H01L 29/7827 (2013.01); H01L 29/0847 (2013.01); H01L 29/1095 (2013.01);
(Continued)

(58) Field of Classification Search
CPC ............. H01L 29/7827; H01L 29/0847; H01L 29/1095; H01L 29/41766; H01L 29/4236;
(Continued)

(56) References Cited

U.S. PATENT DOCUMENTS

| | | | |
|---|---|---|---|
| 6,551,881 B1 * | 4/2003 | Letavic | ............... H01L 29/7813 |
| | | | 438/267 |
| 7,510,953 B2 * | 3/2009 | He | ...................... H01L 27/0629 |
| | | | 438/570 |

(Continued)

FOREIGN PATENT DOCUMENTS

| | | |
|---|---|---|
| JP | 2012-174989 | 9/2012 |
| JP | 2014-33079 | 2/2014 |
| JP | 2014-63852 | 4/2014 |

*Primary Examiner* — Ida M Soward
(74) *Attorney, Agent, or Firm* — Oblon, McClelland, Maier & Neustadt, L.L.P.

(57) ABSTRACT

A semiconductor device according to an embodiment includes a semiconductor layer having a first plane and a second plane; a first and a second electrode; first, second, and third semiconductor regions; first and second gate electrodes in the semiconductor layer; first and second gate insulating films; and an insulating layer provided between the first and second gate electrodes and the first electrode. The first electrode has a first region and a second region. The first region contacts the semiconductor layer. The first region is located between the second region and the first semiconductor region. A first part of the first region is located between the first gate electrode and the second gate electrode. A second part of the first region is interposed between a first portion and a second portion of the insulating layer. The second part of the first region has an inverse tapered shape.

6 Claims, 13 Drawing Sheets

(52) U.S. Cl.
CPC .... *H01L 29/41766* (2013.01); *H01L 29/4236* (2013.01); *H01L 29/66666* (2013.01); *H01L 27/2454* (2013.01); *H01L 29/7813* (2013.01); *H01L 29/7825* (2013.01)

(58) Field of Classification Search
CPC .......... H01L 29/66666; H01L 29/7813; H01L 29/7825; H01L 27/2454
See application file for complete search history.

(56) References Cited

U.S. PATENT DOCUMENTS

| | | | |
|---|---|---|---|
| 7,701,001 B2 * | 4/2010 | Jianjun | H01L 29/1095 257/330 |
| 9,397,185 B2 * | 7/2016 | Watanabe | H01L 29/513 |
| 9,634,095 B2 * | 4/2017 | Oosawa | H01L 29/78 |
| 10,141,410 B2 * | 11/2018 | Shimizu | H01L 21/02529 |
| 10,229,994 B2 * | 3/2019 | Shimizu | H01L 29/7827 |
| 2007/0290260 A1 * | 12/2007 | Adan | H01L 29/7813 257/330 |
| 2012/0214281 A1 | 8/2012 | Tomita et al. | |
| 2013/0056790 A1 * | 3/2013 | Kawamura | H01L 29/402 257/139 |
| 2013/0221498 A1 * | 8/2013 | Hayashi | H01L 29/41766 257/655 |
| 2014/0042531 A1 * | 2/2014 | Park | H01L 29/7813 257/330 |
| 2014/0054690 A1 * | 2/2014 | Shin | H01L 29/407 257/331 |
| 2014/0077292 A1 | 3/2014 | Nogami et al. | |
| 2017/0040316 A1 * | 2/2017 | Soeno | H01L 29/41 |
| 2017/0077274 A1 * | 3/2017 | Naito | H01L 29/7397 |

\* cited by examiner

SEMICONDUCTOR DEVICE INCLUDING AN ELECTRODE HAVING A PART WITH AN INVERSE TAPERED SHAPE

CROSS-REFERENCE TO RELATED APPLICATION

This application is based upon and claims the benefit of priority from Japanese Patent Application No. 2017-180736, filed on Sep. 20, 2017, the entire contents of which are incorporated herein by reference.

FIELD

Embodiments described herein relate generally to a semiconductor device and a method for manufacturing the same.

BACKGROUND

A vertical transistor with a trench gate structure is applied for a power semiconductor device. The vertical transistor with a trench gate structure has a gate electrode formed in a gate trench provided in a semiconductor layer. Examples of the vertical transistor are a metal oxide field effect transistor (MOSFET) and an insulated gate bipolar transistor (IGBT). Since the gate electrode is provided in the trench, the degree of integration is improved and it is possible to reduce the on-resistance of the vertical transistor.

In the vertical transistor with the trench gate structure, a contact region for contact between a source electrode and a source region may be formed between adjacent gate trenches. When the pitch of the gate trenches is reduced in order to increase the degree of integration of the vertical transistor with the trench gate structure, it is difficult to ensure the amount of overlap between the source region and the source electrode. When the amount of overlap between the source region and the source electrode is reduced, there is a concern that contact resistance will increase and the on-resistance of the vertical transistor will increase.

DETAILED DESCRIPTION

Figure 1:
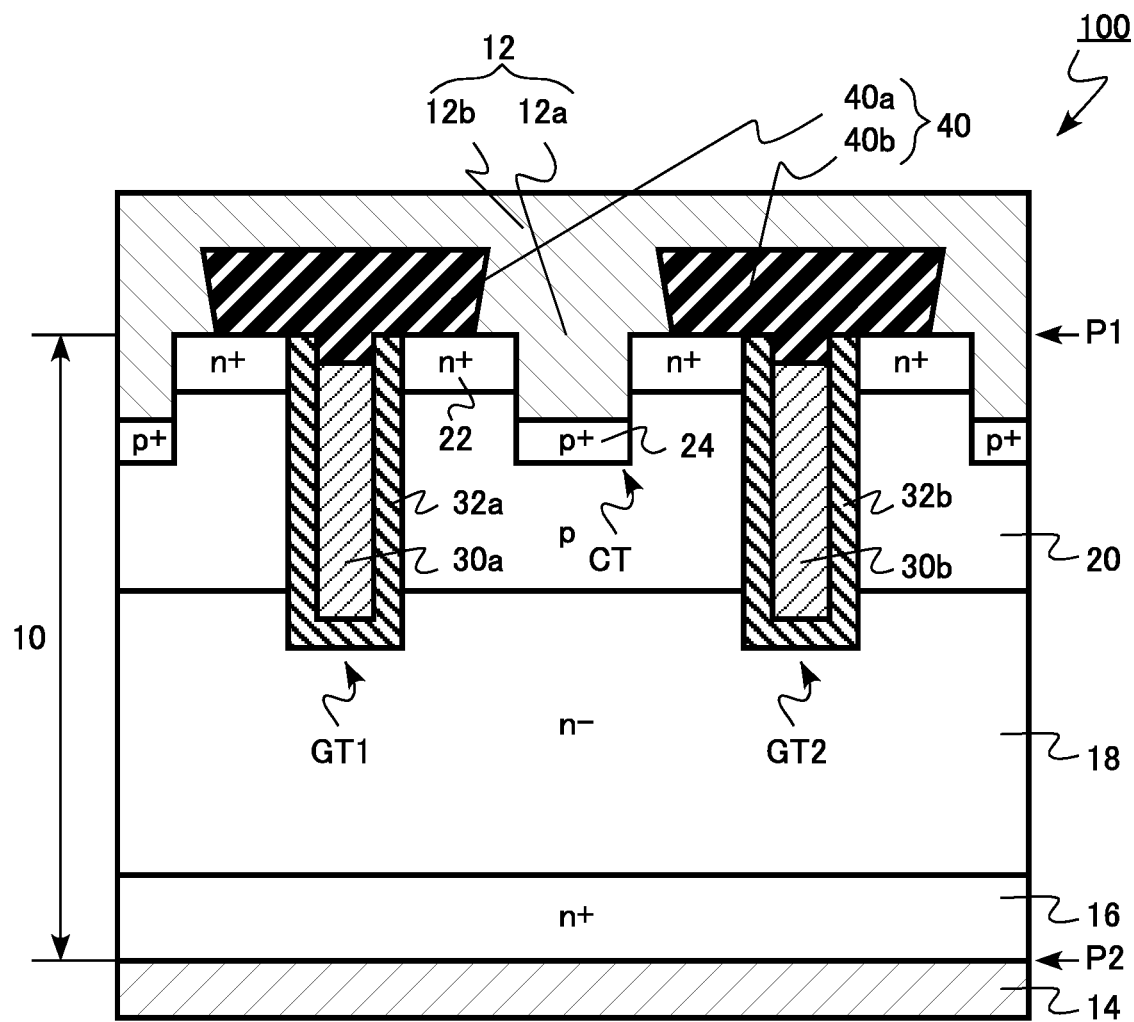
FIG. 1 is a cross-sectional view schematically illustrating a semiconductor device according to a first embodiment.

A semiconductor device according to an embodiment includes: a semiconductor layer having a first plane and a second plane opposite to the first plane; a first electrode contacting the first plane; a second electrode contacting the second plane; a first semiconductor region of a first conductivity type provided in the semiconductor layer; a second semiconductor region of a second conductivity type that is provided in the semiconductor layer and is located between the first semiconductor region and the second plane; a third semiconductor region of the second conductivity type that is provided in the semiconductor layer and is located between the first semiconductor region and the first plane; a first gate electrode provided in the semiconductor layer; a second gate electrode that is provided in the semiconductor layer and faces the first gate electrode, with the first semiconductor region interposed therebetween; a first gate insulating film provided between the first gate electrode and the first semiconductor region; a second gate insulating film provided between the second gate electrode and the first semiconductor region; and an insulating layer provided between the first gate electrode and the first electrode and between the second gate electrode and the first electrode. The first electrode has a first region and a second region. The first region comes into contact with the semiconductor layer. The first region is located between the second region and the first semiconductor region. A first part of the first region is located between the first gate electrode and the second gate electrode. A second part of the first region is interposed between a first portion and a second portion of the insulating layer. The second part of the first region has an inverse tapered shape.

Hereinafter, embodiments of the invention will be described with reference to the drawings. In the following description, for example, the same or similar members are denoted by the same reference numerals and the description of the members that have been described once will not be repeated.

In the specification, an $n^+$ type, an n type, and an $n^-$ type mean that the $n^+$ type has the highest n-type impurity concentration, followed by the n type and the $n^-$ type. In addition, a $p^+$ type, a p type, and a p type mean that the $p^+$ type has the highest p-type impurity concentration, followed by the p type and the $p^-$ type.

First Embodiment

A semiconductor device according to this embodiment includes: a semiconductor layer having a first plane and a second plane opposite to the first plane; a first electrode contacting the first plane; a second electrode contacting the second plane; a first semiconductor region of a first conductivity type provided in the semiconductor layer; a second semiconductor region of a second conductivity type that is provided in the semiconductor layer and is located between the first semiconductor region and the second plane; a third semiconductor region of the second conductivity type that is provided in the semiconductor layer and is located between the first semiconductor region and the first plane; a first gate electrode provided in the semiconductor layer; a second gate electrode that is provided in the semiconductor layer and faces the first gate electrode, with the first semiconductor region interposed therebetween; a first gate insulating film provided between the first gate electrode and the first semiconductor region; a second gate insulating film provided between the second gate electrode and the first semiconductor region; and an insulating layer provided between the first gate electrode and the first electrode and between the second gate electrode and the first electrode. The first electrode has a first region and a second region. The first region comes into contact with the semiconductor layer. The first region is located between the second region and the first semiconductor region. A first part of the first region is located between the first gate electrode and the second gate electrode. A second part of the first region is interposed between a first portion and a second portion of the insulating layer. The second part of the first region has an inverse tapered shape.

Figure 2:
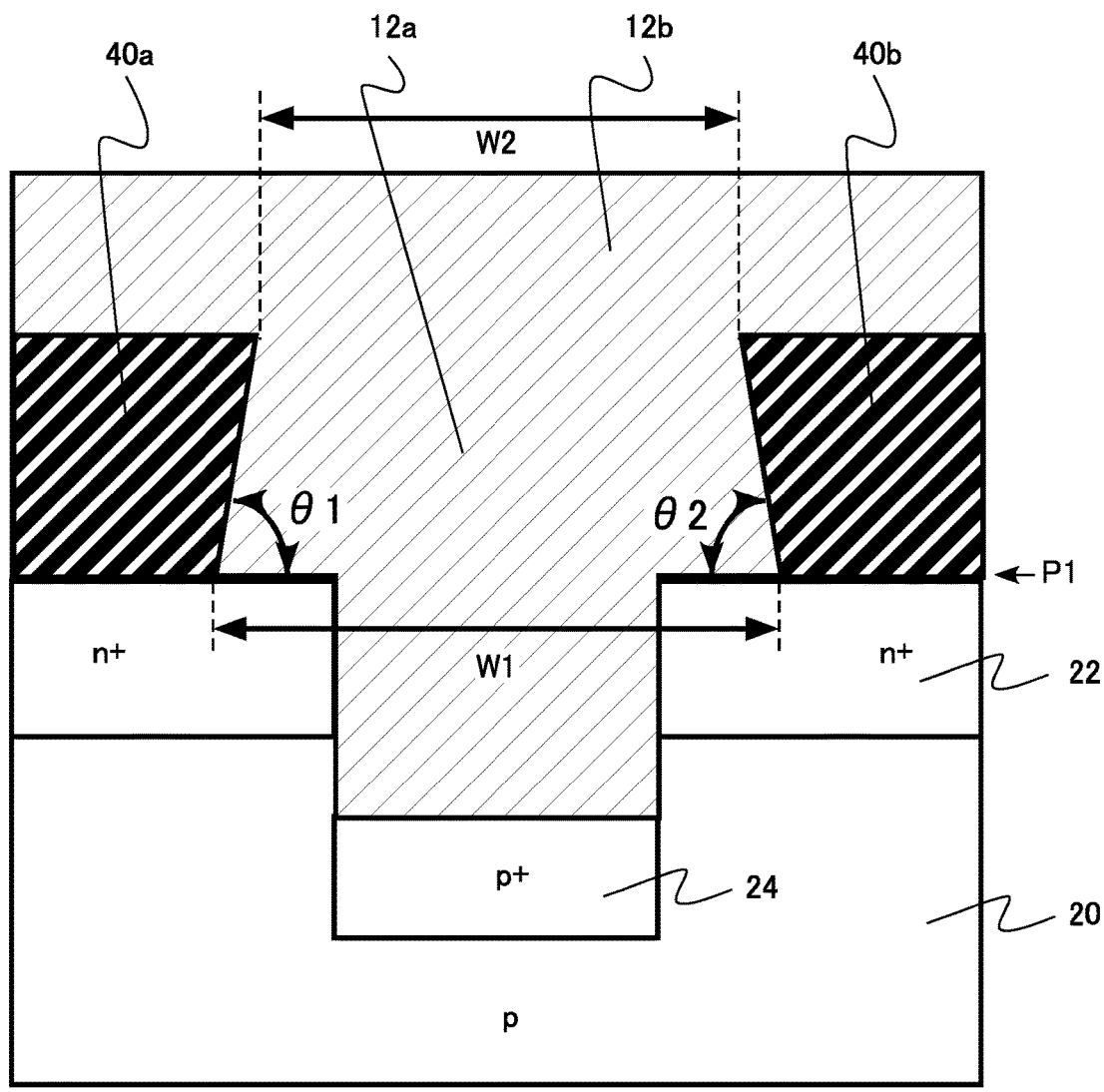
FIG. 2 is a cross-sectional view schematically illustrating a portion of the semiconductor device according to the first embodiment.

FIG. 1 is a cross-sectional view schematically illustrating the semiconductor device according to this embodiment. FIG. 2 is a cross-sectional view schematically illustrating a portion of the semiconductor device according to this embodiment.

The semiconductor device according to this embodiment is a vertical MOSFET 100 with a trench gate structure in which a gate electrode is provided in a gate trench formed in a semiconductor layer. The vertical MOSFET 100 according to this embodiment is an n-channel transistor having an electron as a carrier.

The vertical MOSFET 100 according to this embodiment includes a semiconductor layer 10, a first gate trench GT1 (first trench), a second gate trench GT2 (second trench), a contact trench CT (third trench), a source electrode 12 (first electrode), a drain electrode 14 (second electrode), a drain region 16, a drift region 18 (second semiconductor region), a base region 20 (first semiconductor region), a source region 22 (third semiconductor region), a base contact region 24 (fourth semiconductor region), a first gate electrode 30a, a second gate electrode 30b, a first gate insulating film 32a, a second gate insulating film 32b, and an interlayer insulating layer 40 (insulating layer). The source electrode 12 includes a contact region 12a (first region) and a wiring region 12b (second region). The interlayer insulating layer 40 includes a first portion 40a and a second portion 40b.

The semiconductor layer 10 has a first plane P1 (hereinafter, also referred to as a front surface) and a second plane P2 (hereinafter, also referred to as a rear surface) that is opposite to the first plane P1. The semiconductor layer 10 is made of, for example, single-crystal silicon.

The first gate trench GT1 and the second gate trench GT2 are provided in the semiconductor layer 10. The first gate trench GT1 and the second gate trench GT2 extend, for example, in the depth direction of the plane of paper in FIG. 1. The same gate trenches as the first gate trench GT1 and the second gate trench GT2 are repeatedly arranged at a constant pitch in the semiconductor layer 10.

The base region 20 is provided in the semiconductor layer 10. The base region 20 is located between the first gate trench GT1 and the second gate trench GT2. The base region 20 is a p-type semiconductor region. The base region 20 functions as a channel region of the vertical MOSFET 100. The base region 20 is electrically connected to the source electrode 12.

The source region 22 is provided in the semiconductor layer 10. The source region 22 is provided between the base region 20 and the front surface of the semiconductor layer 10. The source region 22 is provided between the base region 20 and the source electrode 12. The source region 22 is an n$^+$ semiconductor region. The source region 22 is electrically connected to the source electrode 12.

The base contact region 24 is provided in the semiconductor layer 10. The base contact region 24 is provided between the base region 20 and the source electrode 12. The base contact region 24 is provided between the contact region 12a of the source electrode 12 and the base region 20. The base contact region 24 reduces the contact resistance between the source electrode 12 and the base region 20.

The base contact region 24 is a p$^+$ semiconductor region. The base contact region 24 is electrically connected to the source electrode 12.

The drift region 18 is provided in the semiconductor layer 10. The drift region 18 is provided between the base region 20 and the rear surface of the semiconductor layer 10. The drift region 18 is an n$^-$ semiconductor region. The n-type impurity concentration of the drift region 18 is lower than the n-type impurity concentration of the source region 22.

The drain region 16 is provided in the semiconductor layer 10. The drain region 16 is provided between the drift region 18 and the rear surface of the semiconductor layer 10. The drain region 16 is an n$^+$ semiconductor region. The n-type impurity concentration of the drain region 16 is higher than the n-type impurity concentration of the drift region 18. The drain region 16 is electrically connected to the drain electrode 14.

The first gate electrode 30a is provided in the first gate trench GT1. The first gate electrode 30a is made of, for example, polysilicon including n-type impurities or p-type impurities.

A gate voltage is applied to the first gate electrode 30a. The gate voltage is changed to turn on and off the vertical MOS FET 100.

The first gate insulating film 32a is provided in the first gate trench GT1. The first gate insulating film 32a is located between the first gate electrode 30a and the semiconductor layer 10. The first gate insulating film 32a is provided between the first gate electrode 30a and the base region 20. The first gate insulating film 32a is, for example, a silicon oxide film.

The second gate electrode 30b is provided in the second gate trench GT2. The base region 20 is located between the first gate electrode 30a and the second gate electrode 30b. The second gate electrode 30b is made of, for example, polysilicon including n-type impurities or p-type impurities.

A gate voltage is applied to the second gate electrode 30b. The gate voltage is changed to turn on and off the vertical MOS FET 100.

The second gate insulating film 32b is provided in the second gate trench GT2. The second gate insulating film 32b is located between the second gate electrode 30b and the semiconductor layer 10. The second gate insulating film 32b is provided between the second gate electrode 30b and the base region 20. The second gate insulating film 32b is, for example, a silicon oxide film.

The interlayer insulating layer 40 is provided between the first gate electrode 30a and the source electrode 12 and between the second gate electrode 30b and the source electrode 12. The interlayer insulating layer 40 includes the first portion 40a provided on the first gate electrode 30a and the second portion 40b provided on the second gate electrode 30b. The interlayer insulating layer 40 is, for example, a silicon oxide layer.

At least a portion of the source electrode 12 comes into contact with the first plane P1 of the semiconductor layer 10. The source electrode 12 is made of, for example, metal. The source electrode 12 is, for example, a stacked film of titanium and aluminum. A source voltage is applied to the source electrode 12. The source voltage is, for example, 0 V.

The source electrode 12 includes the contact region 12a and the wiring region 12b. The wiring region 12b is connected to the adjacent contact regions 12a.

The contact trench CT is provided in the semiconductor layer 10. The contact trench CT is provided between the first gate trench GT1 and the second gate trench GT2. The contact trench CT extends, for example, in the depth direction of the plane of paper in FIG. 1. The contact trenches CT are repeatedly arranged at a constant pitch in the semiconductor layer 10.

The contact region 12a comes into contact with the semiconductor layer 10. The contact region 12a comes into contact with the semiconductor layer 10 in the front surface (first plane P1) of the semiconductor layer 10 and in the bottom and side of the contact trench CT. The contact region 12a comes into contact with the source region 22 in the front surface of the semiconductor layer 10. The contact region 12a comes into contact with the base contact region 24 in the bottom of the contact trench CT. Simultaneous electrical connection with the source region 22 and the base region 20 is achieved by the contact region 12a.

The contact region 12a is located between the base region 20 and the wiring region 12b. A portion (a first part) of the contact region 12a, that is, a lower part of the contact region 12a is located in the semiconductor layer 10. The lower part of the contact region 12a is located between the first gate electrode 30a and the second gate electrode 30b.

Another portion (a second part) of the contact region 12a, that is, an upper part of the contact region 12a is interposed between the first portion 40a and the second portion 40b of the interlayer insulating layer 40. The contact region 12a interposed between the first portion 40a and the second portion 40b of the interlayer insulating layer 40 has an inverse tapered shape.

In other words, the inverse tapered shape of the contact region 12a means that the width of a portion of the contact region 12a which is close to the semiconductor layer 10 is greater than the width of a portion of the contact region 12a which is far away from the semiconductor layer 10. For example, as illustrated in FIG. 2, the width W1 of a portion of the contact region 12a in the first plane P1 is greater than the width W2 of a portion of the contact region 12a in the upper surface of the interlayer insulating layer 40.

An angle ($\theta 1$ in FIG. 2) formed between the first plane P1 and the boundary between the first portion 40a of the interlayer insulating layer 40 and the contact region 12a is less than 90 degrees. An angle ($\theta 2$ in FIG. 2) formed between the first plane P1 and the boundary between the second portion 40b of the interlayer insulating layer 40 and the contact region 12a is less than 90 degrees. For example, the angle ($\theta 1$ in FIG. 2) formed between the first plane P1 and the boundary between the first portion 40a of the interlayer insulating layer 40 and the contact region 12a is equal to or greater than 85 degrees and less than 90 degrees. The angle ($\theta 2$ in FIG. 2) formed between the first plane P1 and the boundary between the second portion 40b of the interlayer insulating layer 40 and the contact region 12a is equal to or greater than 85 degrees and less than 90 degrees.

At least a portion of the drain electrode 14 comes into contact with the second plane P2 of the semiconductor layer 10. The drain electrode 14 is made of, for example, metal. A drain voltage is applied to the drain electrode 14. The drain voltage is, for example, equal to or greater than 8 V and equal to or less than 1500 V.

Next, the function and effect of the semiconductor device according to this embodiment will be described.

In a vertical transistor with a trench gate structure, a contact region for contact between a source electrode and a source region is formed between adjacent gate trenches. When the pitch of the gate trenches is reduced in order to increase the degree of integration of the vertical transistor with a trench gate structure, it is difficult to ensure a contact area between the source region and the source electrode. When the contact area between the source region and the source electrode is reduced, there is a concern that contact resistance will increase and on-resistance will increase.

In the vertical MOSFET 100 according to this embodiment, the contact region 12a of the source electrode 12 has an inverse tapered shape. With this configuration, the contact area between the source electrode 12 and the source region 22 in the front surface (first plane P1) of the semiconductor layer 10 increases. Therefore, the contact resistance between the source electrode 12 and the source region 22 is reduced. As a result, the on-resistance of the vertical MOSFET 100 is reduced.

In addition, since the contact region 12a of the source electrode 12 has the inverse tapered shape, it is possible to increase the distance between the first gate electrode 30a and the side surface of the contact region 12a and the distance between the second gate electrode 30b and the side surface of the contact region 12a. Therefore, a breakdown voltage between the first gate electrode 30a and the source electrode 12 and a breakdown voltage between the second gate electrode 30b and the source electrode 12 are improved. As a result, the reliability of the vertical MOSFET 100 is improved.

The angle ($\theta 1$ in FIG. 2) formed between the first plane P1 and the boundary between the first portion 40a of the interlayer insulating layer 40 and the contact region 12a is preferably equal to or greater than 85 degrees and less than 90 and more preferably equal to or greater than 85 degrees and equal to or less than 89 degrees. The angle ($\theta 2$ in FIG. 2) formed between the first plane P1 and the boundary between the second portion 40b of the interlayer insulating layer 40 and the contact region 12a is preferably equal to or greater than 85 degrees and less than 90 degrees and more preferably equal to or greater than 85 degrees and equal to or less than 89 degrees. When the angle is greater than the above-mentioned range, there is a concern that it is difficult to sufficiently reduce on-resistance. When the angle is less than the above-mentioned range, there is a concern that the breakdown voltage between the first gate electrode 30a and the source electrode 12 and the breakdown voltage between the second gate electrode 30b and the source electrode 12 will be reduced.

As described above, according to the vertical MOSFET of this embodiment, the contact region 12a of the source electrode 12 has an inverse tapered shape. Therefore, it is possible to reduce the on-resistance of the vertical MOSFET 100. In addition, it is possible to improve the reliability of the vertical MOSFET 100.

Second Embodiment

A method for manufacturing a semiconductor device according to this embodiment includes: forming a first insulating layer on a semiconductor layer that has a first plane and a second plane opposite to the first plane and includes a first semiconductor region of a first conductivity type, a second semiconductor region of a second conductivity type located between the first semiconductor region and the second plane, and a third semiconductor region of the second conductivity type located between the first semiconductor region and the first plane; forming a first opening portion in the first insulating layer; forming a first sidewall on an inner wall surface of the first opening portion; forming a first trench deeper than the first semiconductor region in the semiconductor layer, using the first insulating layer and the first sidewall as a mask; forming a gate insulating film in the first trench; forming a gate electrode on the gate insulating film in the first trench; forming a second insulating layer on the gate electrode; removing the second insulating layer on the first insulating layer; removing the first insulating layer to form a second opening portion in the second insulating layer; forming a second sidewall on an inner wall surface of the second opening portion; forming a second trench in the semiconductor layer such that the second trench is deeper than the third semiconductor region and is shallower than the first semiconductor region, using the second insulating layer and the second sidewall as a mask; removing at least a portion of the second sidewall; and forming an electrode in the second trench. The second sidewall has an inverse tapered shape.

The semiconductor device manufacturing method according to this embodiment is an example of a method for manufacturing the vertical MOSFET 100 according to the first embodiment illustrated in FIGS. 1 and 2. The description of a portion of the same content as that in the first embodiment will not be repeated.

First, a semiconductor layer 10 having a first plane P1 (hereinafter, also referred to as a front surface) and a second plane P2 (hereinafter, also referred to as rear surface) opposite to the first plane P1 is prepared. The semiconductor layer 10 is made of, for example, single-crystal silicon. The semiconductor layer 10 includes an n⁺ drain region 16, an n drift region 18 (second semiconductor region), a p-type base region 20 (first semiconductor region), and an n⁺ source region 22 (third semiconductor region). The drift region 18 is located between the base region 20 and the second plane. The source region 22 is located between the base region 20 and the first plane.

Then, a first mask member 102 (first insulating layer) is formed on the front surface of the semiconductor layer 10.

The first mask member 102 is, for example, a silicon nitride film. The first mask member 102 is deposited by, for example, a chemical vapor deposition (CVD) method.

Figure 3:
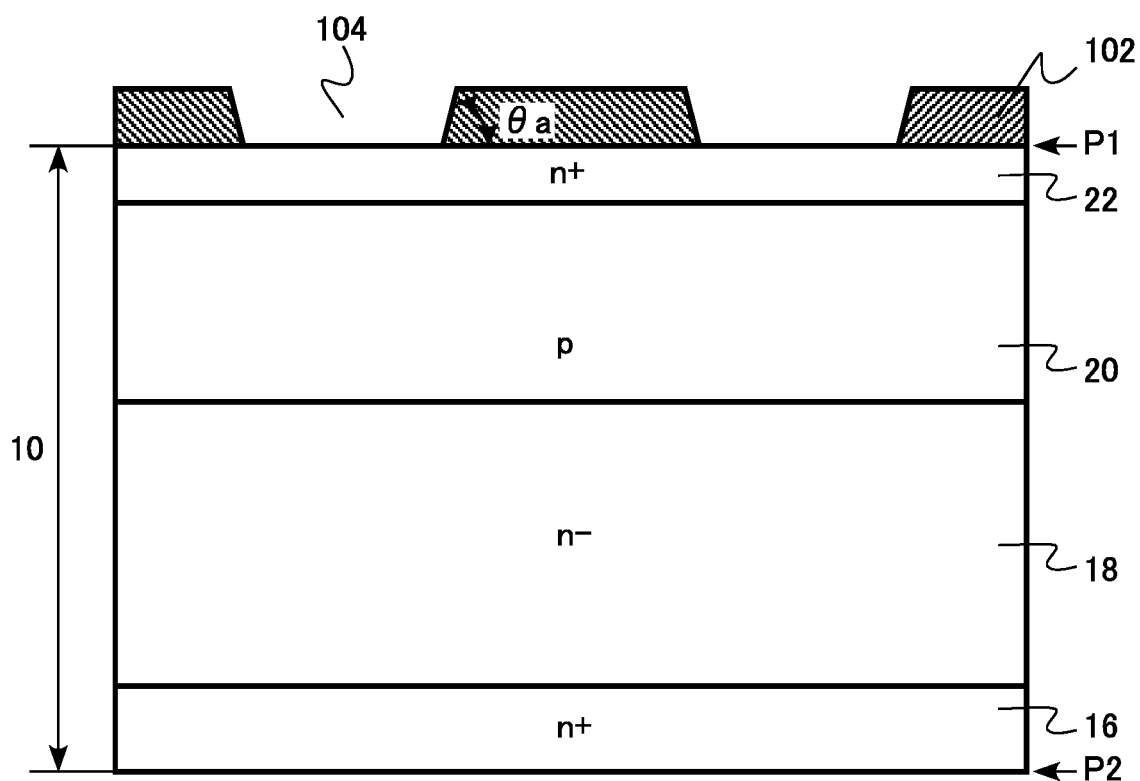
FIG. 3 is a cross-sectional view schematically illustrating a semiconductor device manufacturing method according to a second embodiment.

Then, a first opening portion 104 is formed in the first mask member 102 (FIG. 3). The first opening portion 104 is formed by, for example, a lithography method and a reactive ion etching (RIE) method.

When the first opening portion 104 is formed, processing is performed such that the first opening portion 104 has a forward tapered shape. That is, the first opening portion 104 is formed such that the width of the first opening portion 104 is reduced toward the front surface of the semiconductor layer 10. For example, the etching conditions of the RIE method are controlled to form the forward tapered shape.

An angle (θa in FIG. 3) formed between an inner wall surface of the first opening portion 104 and the front surface of the semiconductor layer 10, that is, the angle of the bottom of the first mask member 102 is less than 90 degrees. The angle (θa in FIG. 3) formed between the inner wall surface of the first opening portion 104 and the front surface of the semiconductor layer 10 is, for example, equal to or greater than 85 degrees and less than 90 degrees.

Figure 4:
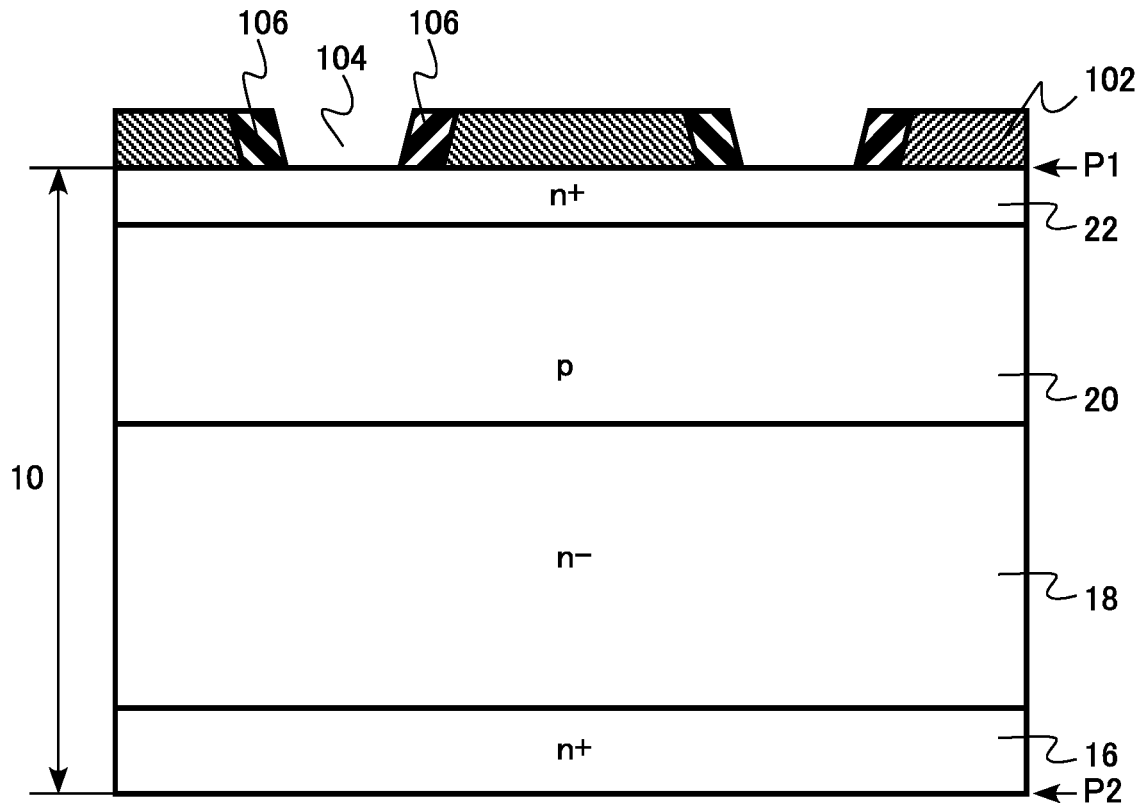
FIG. 4 is a cross-sectional view schematically illustrating the semiconductor device manufacturing method according to the second embodiment.

Then, a first sidewall 106 is formed on the inner wall surface of the first opening portion 104 (FIG. 4). The first sidewall 106 is, for example, a silicon oxide film.

The first sidewall 106 is formed as follows. For example, first, a film for forming the first sidewall 106 is deposited by the CVD method. The deposited film is etched by anisotropic etching using the RIE method. The etching causes the film to remain on only the inner wall surface of the first opening portion 104 and the film becomes the first sidewall 106. The first sidewall 106 also has a forward tapered shape in which the shape of the inner wall surface of the first opening portion 104 is reflected.

Figure 5:
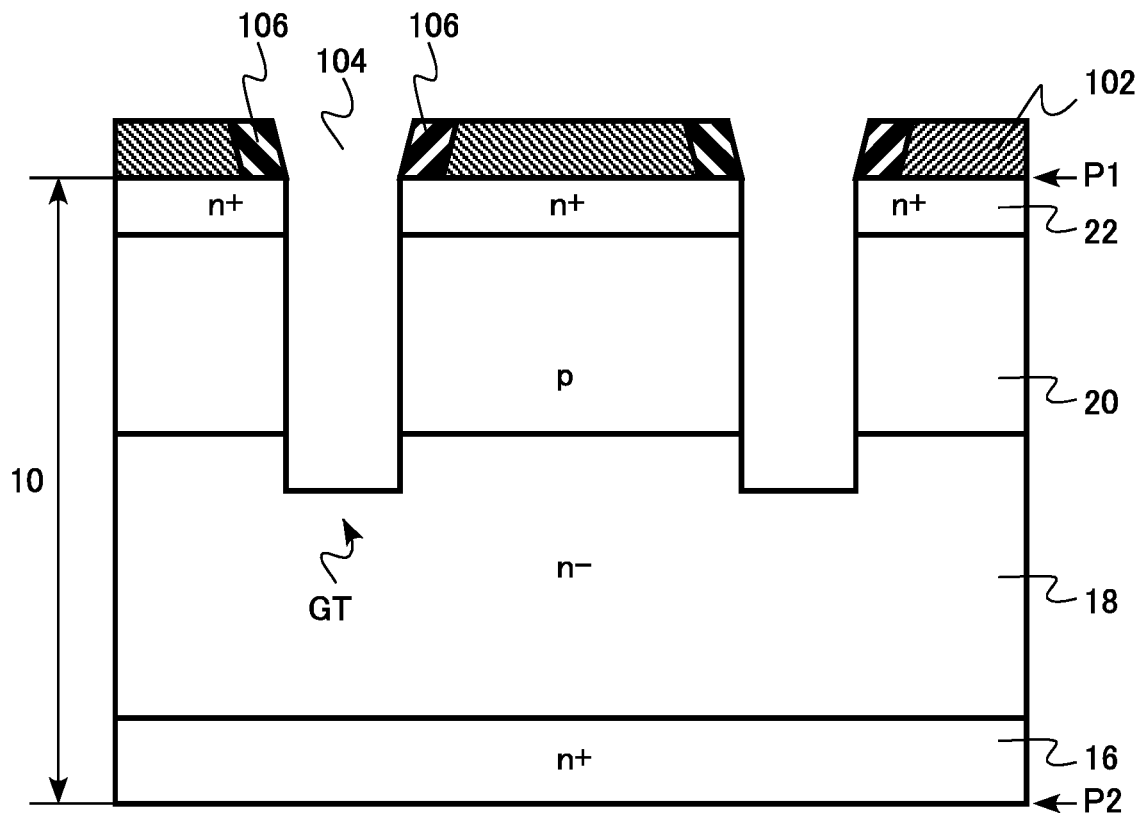
FIG. 5 is a cross-sectional view schematically illustrating the semiconductor device manufacturing method according to the second embodiment.

Then, a gate trench GT (first trench) is formed in the semiconductor layer 10 (FIG. 5). The gate trench GT is formed by, for example, the RIE method using the first mask member 102 and the first sidewall 106 as a mask. The gate trench GT is formed so as to be deeper than the base region 20.

Then, a gate insulating film 32 is formed in the gate trench GT. The gate insulating film 32 is formed by, for example, a thermal oxidation method, or the thermal oxidation method and the CVD method. The gate insulating film 32 is, for example, a silicon oxide film.

Figure 6:
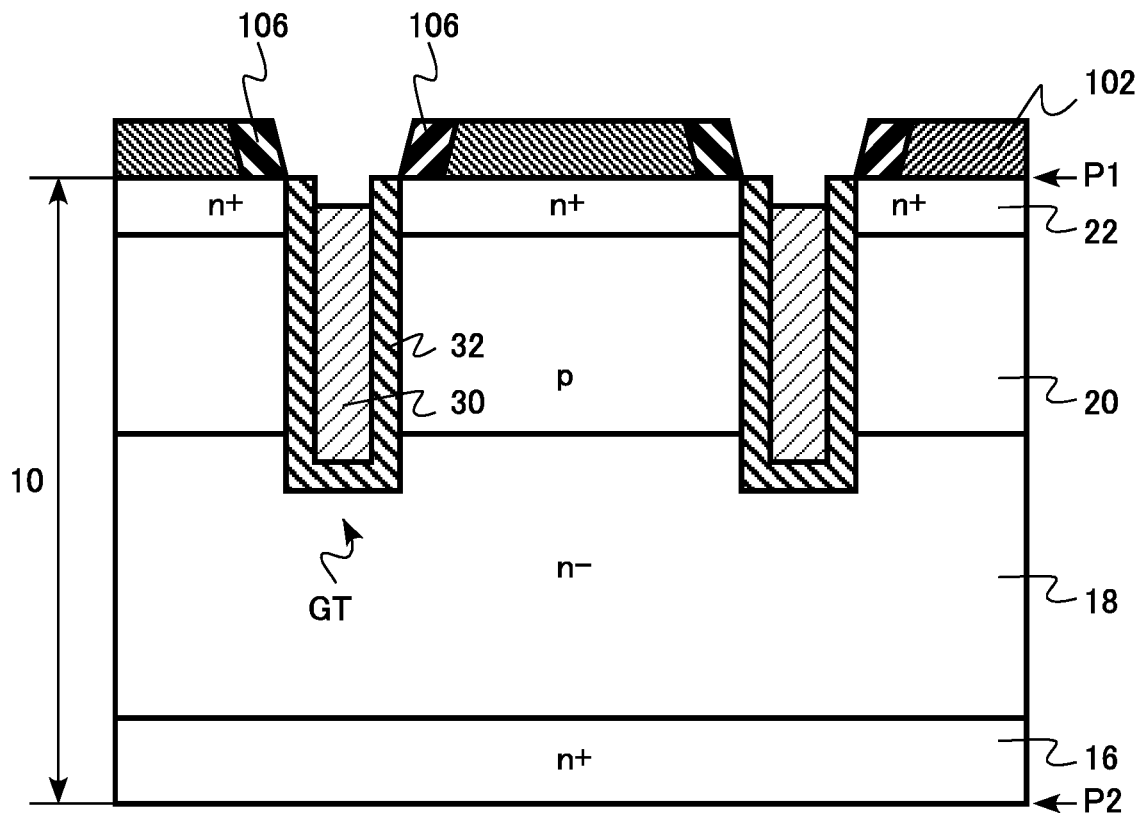
FIG. 6 is a cross-sectional view schematically illustrating the semiconductor device manufacturing method according to the second embodiment.

Then, a gate electrode 30 is formed on the gate insulating film 32 in the gate trench GT (FIG. 6). The gate electrode 30 is made of, for example, polysilicon including n-type impurities or p-type impurities. The gate electrode 30 is formed by, for example, the deposition of a film by the CVD method and etching using an isotropic dry etching method.

Figure 7:
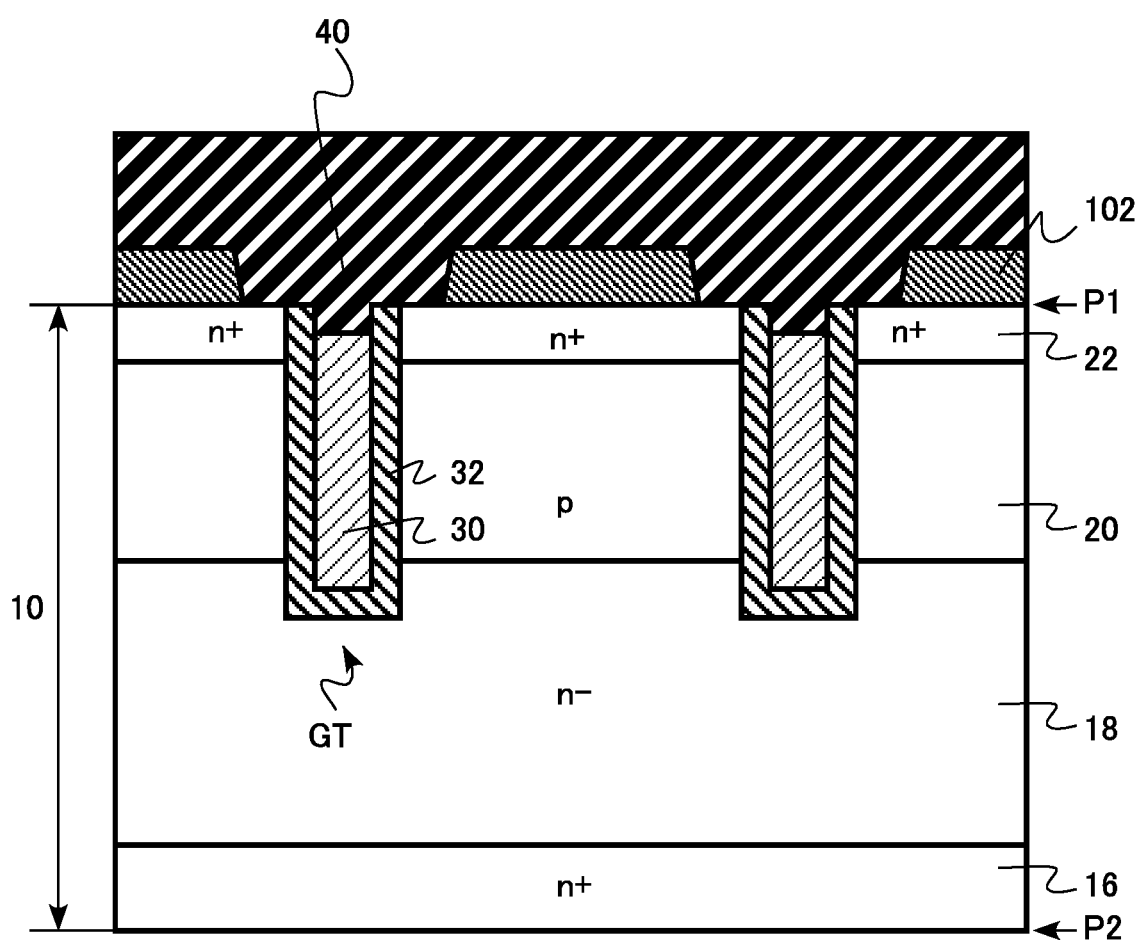
FIG. 7 is a cross-sectional view schematically illustrating the semiconductor device manufacturing method according to the second embodiment.

Then, an interlayer insulating layer 40 (second insulating layer) is formed on the gate electrode 30 (FIG. 7). The interlayer insulating layer 40 is, for example, a silicon oxide layer. The interlayer insulating layer 40 is deposited by, for example, the CVD method.

Figure 8:
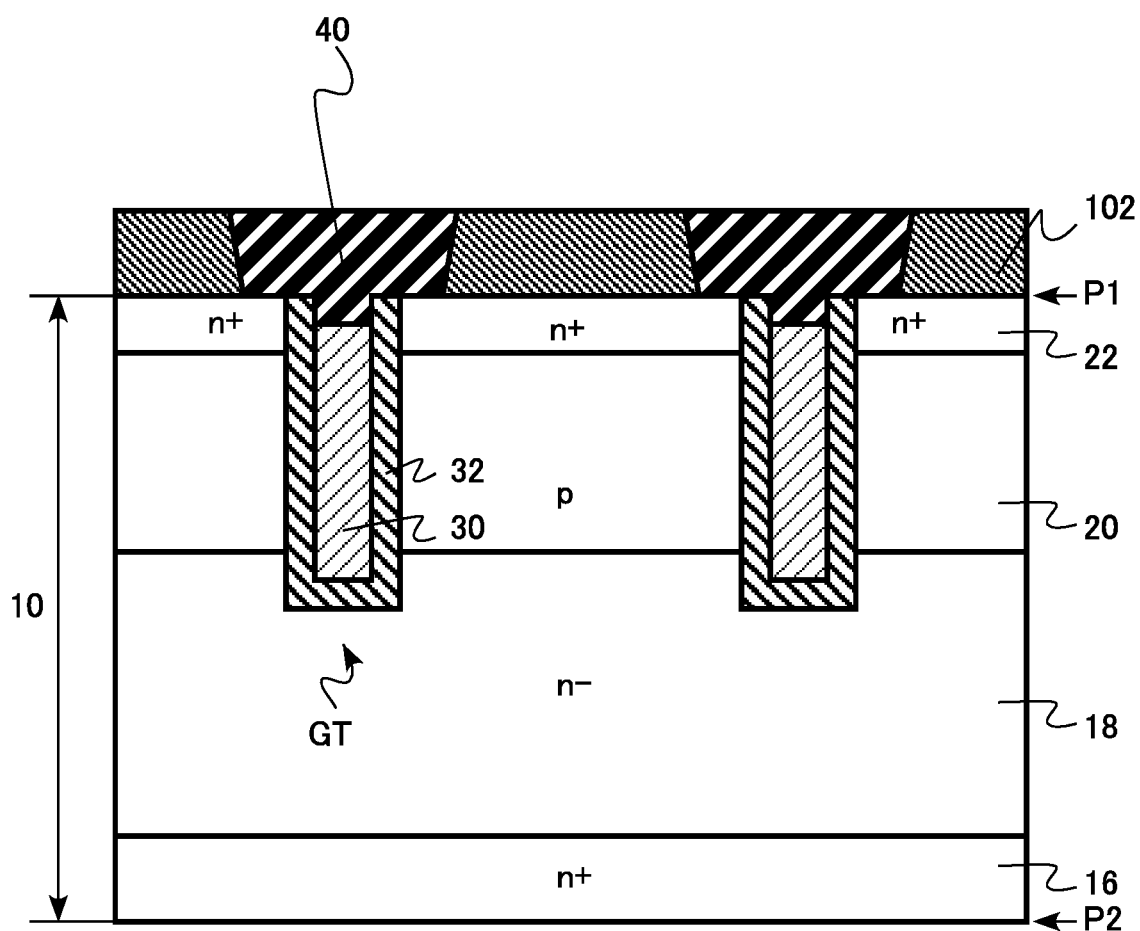
FIG. 8 is a cross-sectional view schematically illustrating the semiconductor device manufacturing method according to the second embodiment.

Then, the interlayer insulating layer 40 on the first mask member 102 is removed (FIG. 8). The interlayer insulating layer 40 is removed by, for example, the RIE method.

Figure 9:
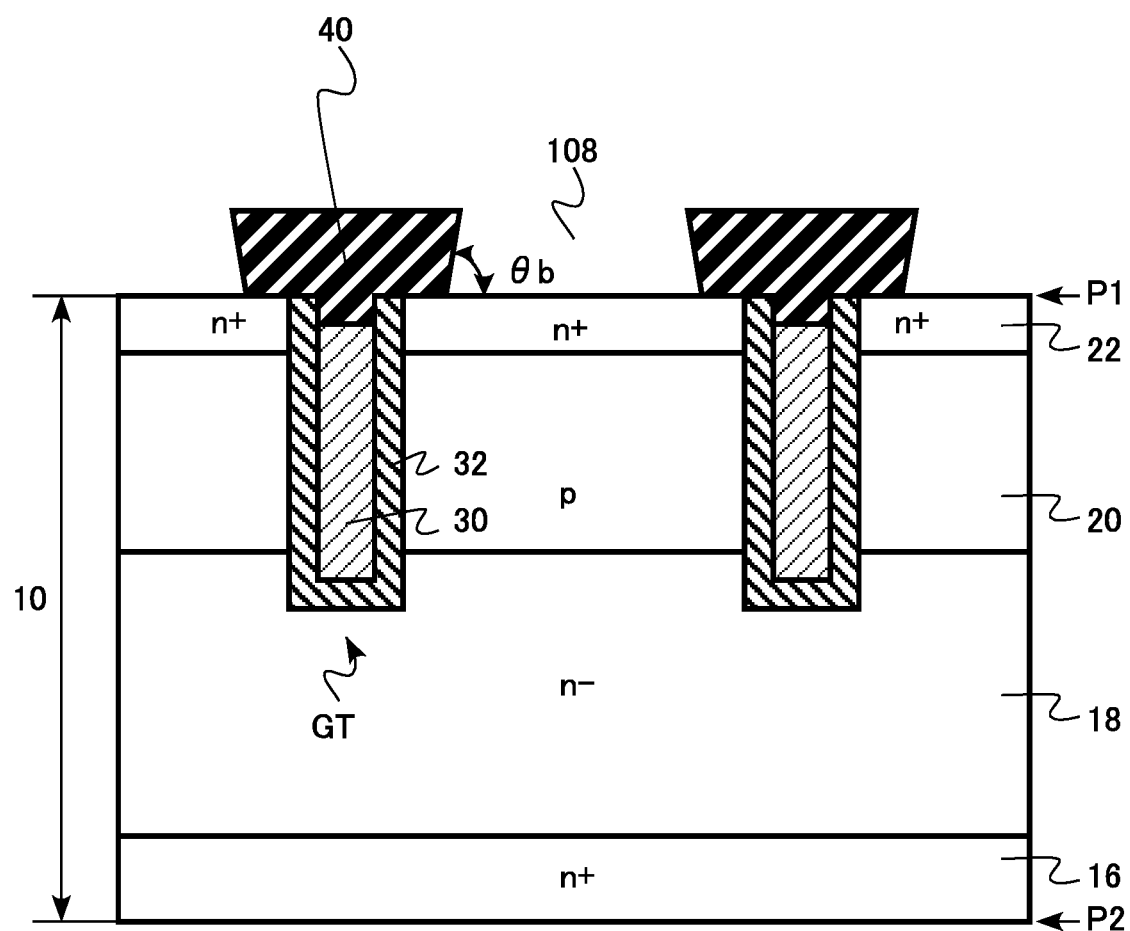
FIG. 9 is a cross-sectional view schematically illustrating the semiconductor device manufacturing method according to the second embodiment.

Then, the first mask member 102 is removed to form a second opening portion 108 in the interlayer insulating layer 40 (FIG. 9). The removal of the first mask member 102 is selectively performed to the interlayer insulating layer 40. The first mask member 102 is removed using, for example, a phosphoric acid solution.

When the second opening portion 108 is formed, processing is performed such that the second opening portion 108 has an inverse tapered shape. That is, the second opening portion 108 is formed such that the width of the second opening portion 108 increases toward the front surface of the semiconductor layer 10. The forward tapered shape of the first opening portion 104 provided in the first mask member 102 is transferred such that the second opening portion 108 has the inverse tapered shape. An angle (θb in FIG. 9) formed between an inner wall surface of the second opening portion 108 and the front surface of the semiconductor layer 10 is less than 90 degrees. The angle (θb in FIG. 9) formed between the inner wall surface of the second opening portion 108 and the front surface of the semiconductor layer 10 is, for example, equal to or greater than 85 degrees and less than 90 degrees.

Figure 10:
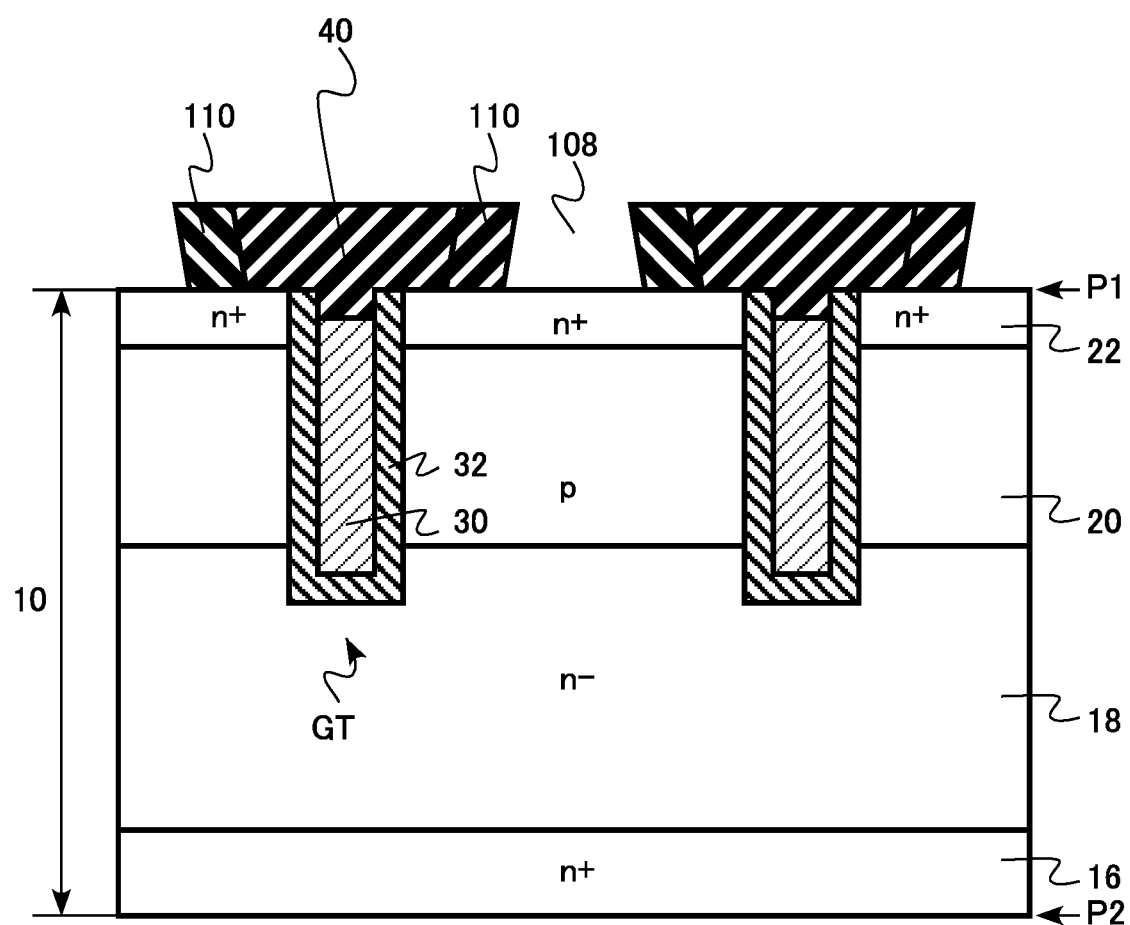
FIG. 10 is a cross-sectional view schematically illustrating the semiconductor device manufacturing method according to the second embodiment.

Then, a second sidewall 110 is formed on the inner wall surface of the second opening portion 108 (FIG. 10). The second sidewall 110 is, for example, a silicon oxide film.

The second sidewall 110 is formed as follows. For example, a film for forming the second sidewall 110 is deposited by the CVD method. Then, the deposited film is etched by anisotropic etching using the RIE method. The etching causes the film to remain on only the inner wall surface of the second sidewall 110 and the film becomes the second sidewall 110. The second sidewall 110 also has an inverse tapered shape in which the shape of the second opening portion 108 is reflected.

Figure 11:
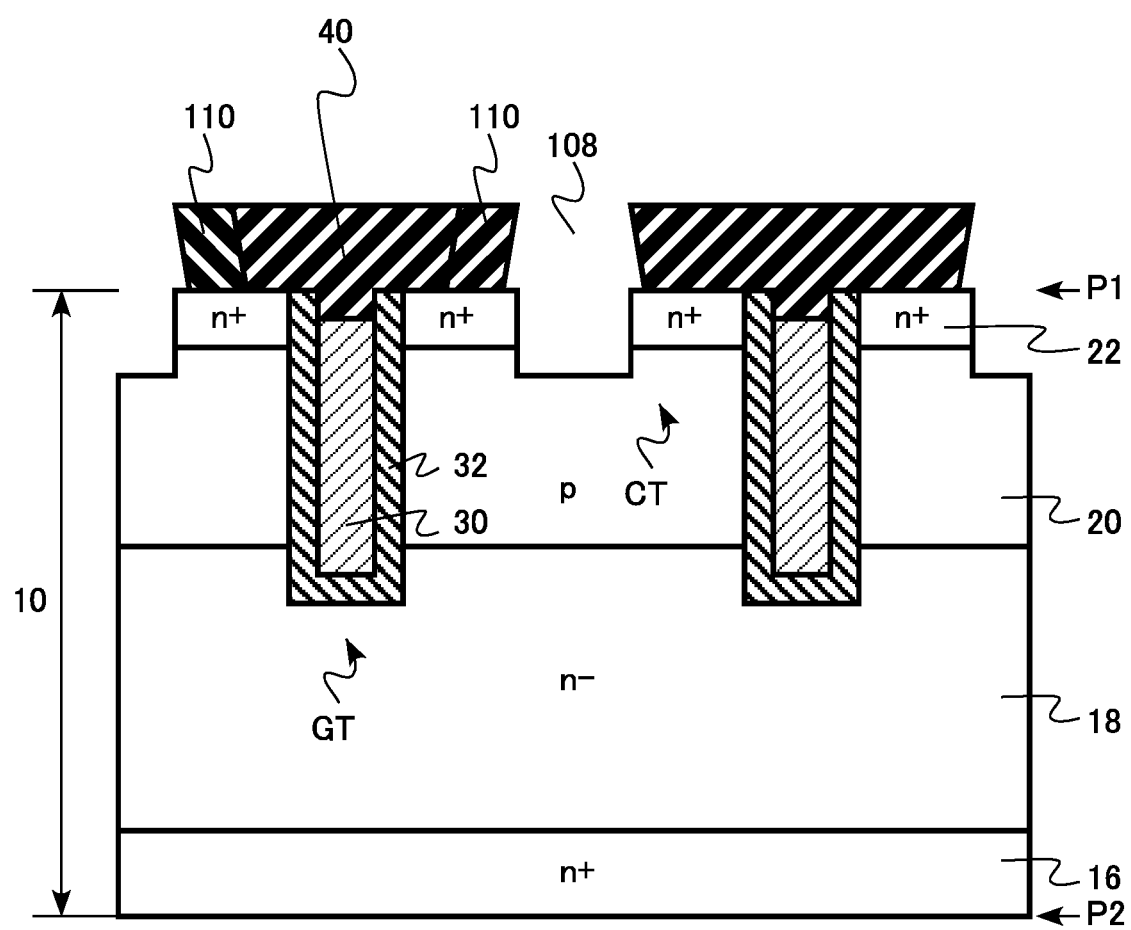
FIG. 11 is a cross-sectional view schematically illustrating the semiconductor device manufacturing method according to the second embodiment.

Then, a contact trench CT (second trench) is formed in the semiconductor layer 10 (FIG. 11). The contact trench CT is formed by, for example, the RIE method using the interlayer insulating layer 40 and the second sidewall 110 as a mask. The contact trench CT is formed such that it is deeper than the source region 22 and is shallower than the base region 20.

Figure 12:
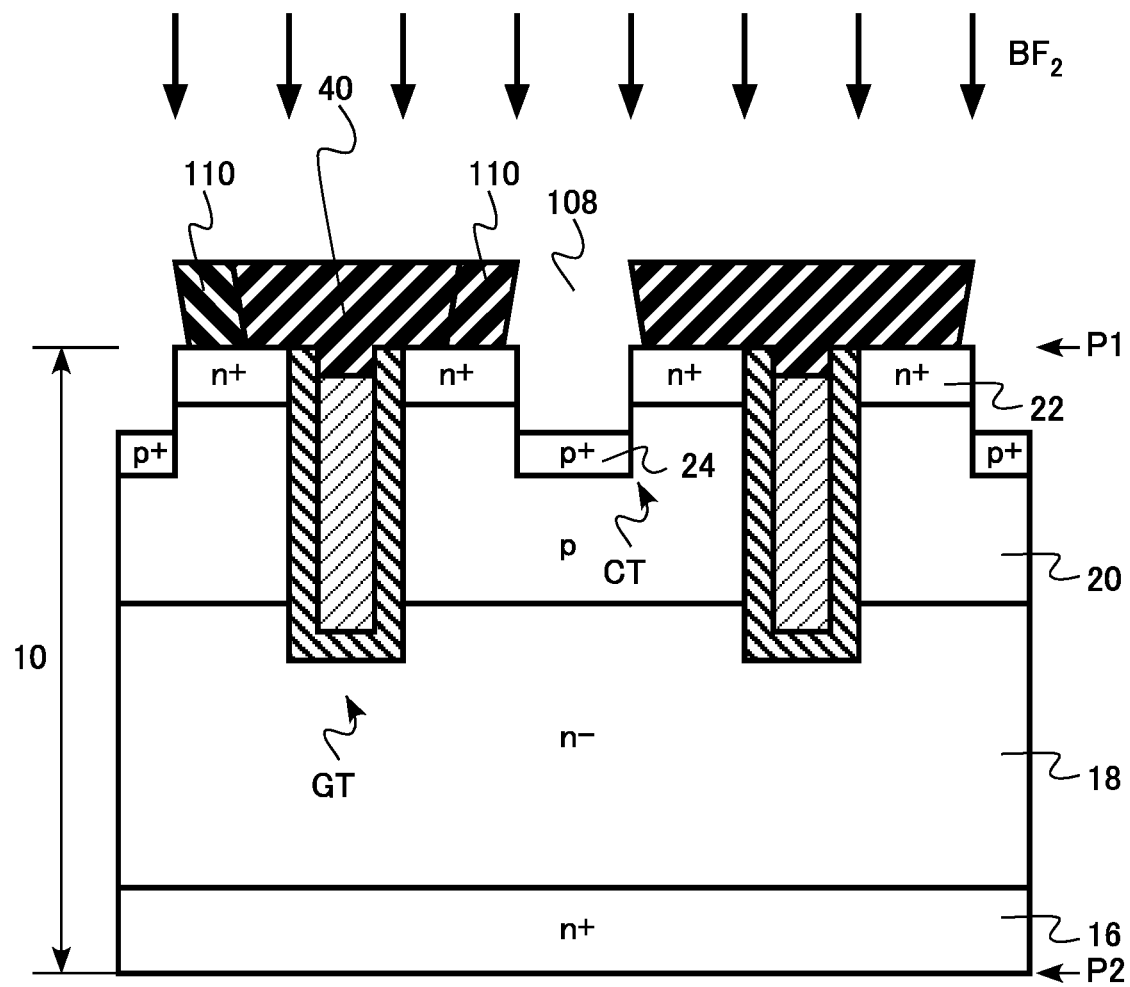
FIG. 12 is a cross-sectional view schematically illustrating the semiconductor device manufacturing method according to the second embodiment.

Then, a $p^+$ base contact region 24 is formed at the bottom of the contact trench CT in the semiconductor layer 10 (FIG. 12). The base contact region 24 is formed by, for example, an ion implantation method. The base contact region 24 is formed by, for example, the implantation of boron fluoride ions.

Figure 13:
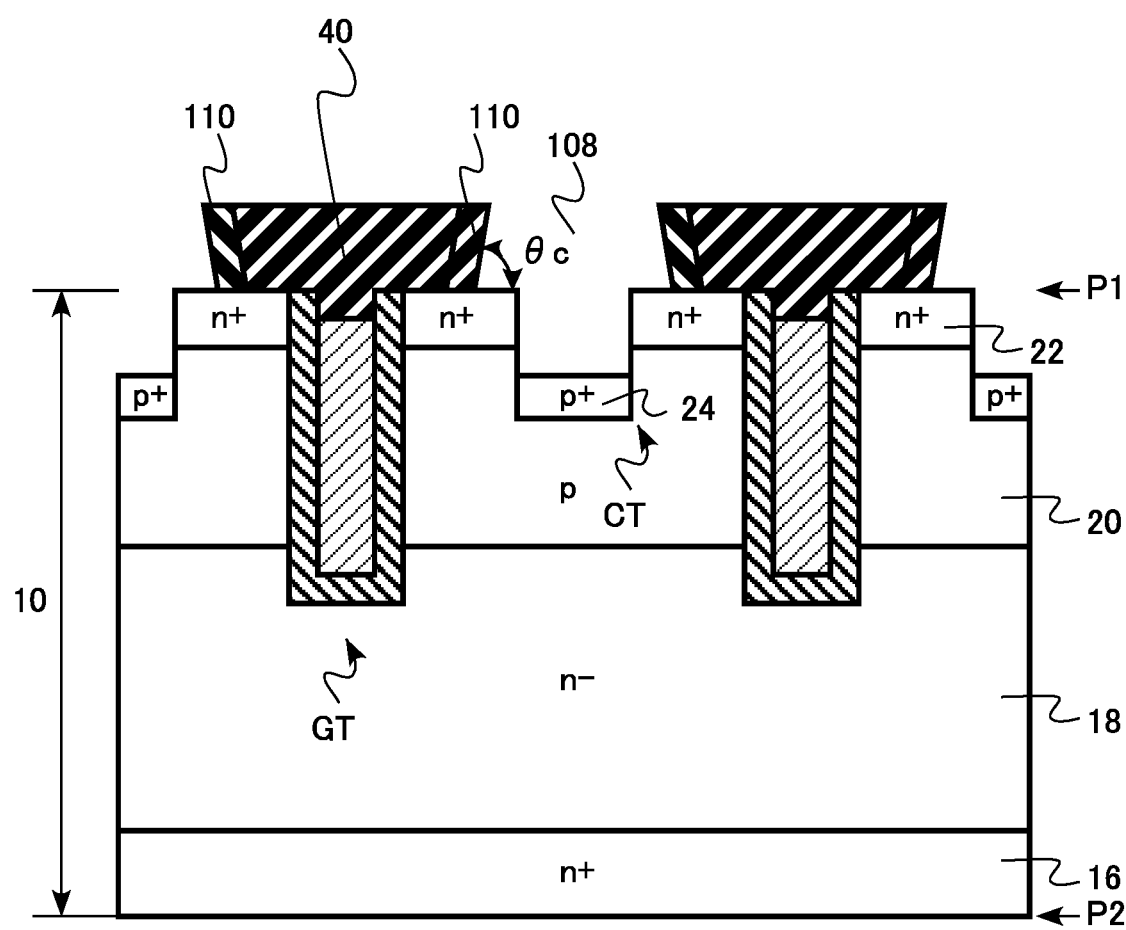
FIG. 13 is a cross-sectional view schematically illustrating the semiconductor device manufacturing method according to the second embodiment.

Then, at least a portion of the second sidewall 110 is removed (FIG. 13). At least a portion of the second sidewall 110 is removed by, for example, wet etching such that the inner wall surface of the second sidewall 110 recedes. The inner wall surface of the second sidewall 110 has an inverse tapered shape. An angle ($\theta$c in FIG. 13) formed between the receding inner wall surface of the second sidewall 110 and the front surface of the semiconductor layer 10 is less than 90 degrees. The angle ($\theta$c in FIG. 13) formed between the receding inner wall surface of the second sidewall 110 and the front surface of the semiconductor layer 10 is, for example, equal to or greater than 85 degrees and less than 90 degrees. In addition, the entire second sidewall 110 may be removed.

Then, a source electrode 12 and a drain electrode 14 are formed. The source electrode 12 and the drain electrode 14 are formed by, for example, a metal film sputtering method.

The vertical MOSFET 100 according to the first embodiment illustrated in FIGS. 1 and 2 is manufactured by the above-mentioned manufacturing method.

Next, the function and effect of the semiconductor device manufacturing method according to this embodiment will be described.

In a vertical transistor with a trench gate structure, a contact region for contact between a source electrode and source and base regions is formed between adjacent gate trenches. A contact trench is provided between adjacent gate trenches, which makes it possible to bring the source electrode into contact with the source region and the base region at the same time in a small space.

However, when the pitch of the gate trenches is reduced in order to increase the degree of integration of the vertical transistor with a trench gate structure, it is difficult to ensure the distance between the gate trench and the contact trench. When the distance between the gate trench and the contact trench is reduced, for example, the threshold voltage of a transistor formed on the side surface of the gate trench is changed by the influence of a p-type diffusion layer in a base contact region that is provided at the bottom of the contact trench, which causes problems.

In the semiconductor device manufacturing method according to this embodiment, the second opening portion 108 for forming the contact trench CT is formed by self-alignment with respect to the first opening portion 104 for forming the gate trench GT. Therefore, the contact trench CT can be formed by self-alignment with respect to the gate trench GT. In other words, the gate trench GT and the contact trench CT can be formed such that the position of the trenches is not related to the accuracy of alignment in lithography.

Therefore, it is easy to ensure the distance between the gate trench GT and the contact trench CT. It is possible to reduce the pitch of the gate trenches. As a result, it is possible to manufacture the vertical MOSFET 100 with a high degree of integration.

In the semiconductor device manufacturing method according to this embodiment, the second sidewall 110 is formed on the second opening portion 108 to reduce the width of the contact trench CT. Therefore, it is easy to ensure the distance between the gate trench GT and the contact trench CT. It is possible to further reduce the pitch of the gate trenches. As a result, it is possible to manufacture the vertical MOSFET 100 of which the degree of integration is further improved.

In the semiconductor device manufacturing method according to this embodiment, after the contact trench CT is formed, the second sidewall 110 recedes to increase the contact area between the source electrode 12 and the source region 22. Therefore, the contact resistance between the source electrode 12 and the source region 22 is reduced. As a result, it is possible to manufacture the vertical MOSFET 100 with low on-resistance.

In the semiconductor device manufacturing method according to this embodiment, the second sidewall 110 is formed in the second opening portion 108 to reduce the width of the contact trench CT. It is possible to increase the contact area between the source electrode 12 and the source region 22, using the front surface of the semiconductor layer 10 ensured by reducing the width of the contact trench CT.

According to the manufacturing method of this embodiment, since the contact region 12a of the source electrode 12 has an inverse tapered shape, it is possible to manufacture the vertical MOSFET 100 of which the on-resistance is further reduced. In addition, since the distance between the gate electrode 30 and the side surface of the contact region 12a is long, it is possible to manufacture the vertical MOSFET 100 with high reliability.

As described above, according to the vertical MOSFET of this embodiment, it is possible to manufacture the vertical MOSFET 100 with a high degree of integration. In addition, it is possible to manufacture the vertical MOSFET 100 with low on-resistance. Furthermore, it is possible to manufacture the vertical MOSFET 100 with high reliability.

In the semiconductor device manufacturing method according to the second embodiment, the case in which the vertical MOSFET 100 in which the contact region 12a of the source electrode 12 has an inverse tapered shape has been described as an example. However, the second embodiment may be applied to the manufacture of a vertical MOSFET in which the contact region 12a of the source electrode 12 has a vertical shape or a forward tapered shape. In this case, for example, when the first opening portion 104 is formed, processing may be performed such that the first opening portion 104 has a vertical shape or an inverse tapered shape.

In the first and second embodiments, the case in which the semiconductor layer is made of single-crystal silicon has been described. However, the material forming the semiconductor layer is not limited to the single-crystal silicon. For example, other single-crystal semiconductors, such as single-crystal silicon carbide, may be used.

In the first and second embodiments, the n-channel transistor in which the first conductivity type is a p type and the second conductivity type is an n type has been described as an example. The first and second embodiments may be applied to a p-channel transistor in which the first conductivity type is an n type and the second conductivity type is a p type.

In the first and second embodiments, the case in which the vertical transistor is a vertical MOSFET has been described as an example. However, the vertical transistor may be a vertical IGBT.

While certain embodiments have been described, these embodiments have been presented byway of example only, and are not intended to limit the scope of the inventions. Indeed, the semiconductor device and the method for manufacturing the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor layer having a first plane and a second plane opposite to the first plane;
   a first electrode contacting the first plane, the first electrode including a first region and a second region;
   a second electrode contacting the second plane;
   a first semiconductor region of a first conductivity type provided in the semiconductor layer;
   a second semiconductor region of a second conductivity type provided in the semiconductor layer, the second semiconductor region being located between the first semiconductor region and the second plane;
   a third semiconductor region of the second conductivity type provided in the semiconductor layer, the third semiconductor region being located between the first semiconductor region and the first plane;
   a first gate electrode provided in the semiconductor layer;
   a second gate electrode provided in the semiconductor layer, the first semiconductor region being located between the second gate electrode and the first gate electrode;
   a first gate insulating film provided between the first gate electrode and the first semiconductor region;
   a second gate insulating film provided between the second gate electrode and the first semiconductor region; and
   an insulating layer including a first portion and a second portion, the first portion provided between the first gate electrode and the first electrode, and the second portion provided between the second gate electrode and the first electrode, wherein
   the first region contacts the semiconductor layer,
   the first region is located between the second region and the first semiconductor region,
   a first part of the first region is located between the first gate electrode and the second gate electrode,
   a second part of the first region is interposed between the first portion and the second portion, and
   the second part of the first region has an inverse tapered shape.

2. The semiconductor device according to claim 1, wherein
   an angle formed between the first plane and a boundary between the first portion of the insulating layer and the first region is equal to or greater than 85 degrees and less than 90 degrees, and
   an angle formed between the first plane and a boundary between the second portion of the insulating layer and the first region is equal to or greater than 85 degrees and less than 90 degrees.

3. The semiconductor device according to claim 1, wherein
   an angle formed between the first plane and a boundary between the first portion of the insulating layer and the first region is equal to or greater than 85 degrees and equal to or less than 89 degrees, and
   an angle formed between the first plane and a boundary between the second portion of the insulating layer and the first region is equal to or greater than 85 degrees and equal to or less than 89 degrees.

4. The semiconductor device according to claim 1, further comprising:
   a fourth semiconductor region of the first conductivity type provided in the semiconductor layer, the fourth semiconductor region being located between the first region and the first semiconductor region, a first-conductivity-type impurity concentration of the fourth semiconductor region being higher than a first-conductivity-type impurity concentration of the first semiconductor region.

5. The semiconductor device according to claim 1, wherein the insulating layer includes silicon oxide.

6. The semiconductor device according to claim 1, wherein the semiconductor layer is made of silicon.

* * * * *